(12) United States Patent
Ramaswamy et al.

(10) Patent No.: US 12,130,561 B2
(45) Date of Patent: Oct. 29, 2024

(54) GAS DISTRIBUTION PLATE WITH UV BLOCKER

(71) Applicant: Applied Materials, Inc., Santa Clara, CA (US)

(72) Inventors: Kartik Ramaswamy, San Jose, CA (US); Michael D. Willwerth, Campbell, CA (US); Yang Yang, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 130 days.

(21) Appl. No.: 17/892,211

(22) Filed: Aug. 22, 2022

(65) Prior Publication Data

US 2023/0102933 A1 Mar. 30, 2023

Related U.S. Application Data

(63) Continuation of application No. 17/484,605, filed on Sep. 24, 2021, now Pat. No. 11,448,977.

(51) Int. Cl.
G03F 7/42 (2006.01)
G03F 7/00 (2006.01)
H01J 37/32 (2006.01)

(52) U.S. Cl.
CPC .......... *G03F 7/70808* (2013.01); *G03F 7/42* (2013.01); *G03F 7/427* (2013.01); *G03F 7/70925* (2013.01); *H01J 37/32633* (2013.01); *H01J 2237/3342* (2013.01)

(58) Field of Classification Search
CPC ...... G03F 7/42; G03F 7/427; H01J 37/32357; H01J 2237/3342; H01J 37/32633
See application file for complete search history.

(56) References Cited

U.S. PATENT DOCUMENTS

| | | | |
|---|---|---|---|
| 5,968,275 A * | 10/1999 | Lee | H01L 21/31138 438/731 |
| 6,444,040 B1 * | 9/2002 | Herchen | C23C 16/45565 156/345.34 |
| 6,537,419 B1 | 3/2003 | Kinnard | |

(Continued)

FOREIGN PATENT DOCUMENTS

| EP | 1016134 B1 | 2/2006 |
|---|---|---|
| KR | 10-0997104 B1 | 11/2010 |

OTHER PUBLICATIONS

PCT International Seach Report and Written Opinion for PCT/US2022/040298 filed Nov. 30, 2022.

*Primary Examiner* — Steven H Whitesell
(74) *Attorney, Agent, or Firm* — Moser Taboa

(57) ABSTRACT

Apparatus for processing substrates can include a gas distribution plate that includes an upper plate and a lower plate and a solid disk between the upper plate and the lower plate. Each of the upper plate and the lower plate has a central region and an outer region surrounding the central region, the central region being solid and the outer region having a plurality of through holes. The upper plate and the lower plate are coaxially aligned along a central axis extending through a center of the central region of the upper plate and a center of the central region of the lower plate. The solid disk is coaxially aligned with the upper plate and the lower plate. The solid disk is configured to block transmission of ultraviolet radiation through the solid disk.

14 Claims, 3 Drawing Sheets

(56) References Cited

U.S. PATENT DOCUMENTS

| | | | |
|---|---|---|---|
| 6,761,796 B2* | 7/2004 | Srivastava | H01J 37/321 |
| | | | 156/345.35 |
| 7,449,416 B2* | 11/2008 | Becknell | H01J 37/32449 |
| | | | 257/E21.256 |
| 7,585,686 B2 | 9/2009 | Verhaverbeke et al. | |
| 10,570,517 B2 | 2/2020 | Bansal et al. | |
| 2003/0010452 A1* | 1/2003 | Park | C23C 16/45565 |
| | | | 156/345.33 |
| 2003/0205328 A1* | 11/2003 | Kinnard | C23C 16/45572 |
| | | | 118/724 |
| 2005/0150601 A1* | 7/2005 | Srivastava | H01L 21/67115 |
| | | | 156/345.33 |
| 2005/0241767 A1* | 11/2005 | Ferris | H01J 37/32633 |
| | | | 156/345.35 |
| 2015/0315706 A1 | 11/2015 | Chandrasekharan et al. | |
| 2018/0174870 A1 | 6/2018 | Yang et al. | |

\* cited by examiner

GAS DISTRIBUTION PLATE WITH UV BLOCKER

CROSS-REFERENCE TO RELATED APPLICATIONS

This application is a continuation of and claims the benefit of U.S. patent application Ser. No. 17/484,605, filed Sep. 24, 2021, which is herein incorporated by reference in its entirety.

FIELD

Embodiments of the present disclosure generally relate to apparatuses for processing substrates, and more specifically, to apparatuses that block transmission of ultraviolet (UV) radiation to substrates.

BACKGROUND

Substrates for use in the semiconductor manufacturing industry are often cleaned to remove unwanted materials such as contaminants or other unwanted particles generated thereon during processing. Substrates may include semiconductor wafers, chamber components, photomasks, or the like.

Photoresist is used in semiconductor wafer fabrication to transfer a circuit pattern onto the wafer. Once the photoresist pattern is applied, remaining photoresist must be removed from the photomask before the photomask is used again. Some photoresist removal may take place on semiconductor wafers. Example photoresist removal applications include post-metal etch, post-poly etch, post-dielectric etch, post-implant, and photolithography rework.

Gas plasma stripping is one way of removing photoresist from a semiconductor wafer. However, the inventors have observed that some gas plasma stripping devices and methods expose the semiconductor wafer to UV radiation emitted as a product of gas plasma stripping. The UV radiation can damage the semiconductor wafer.

Accordingly, the inventors have provided improved apparatuses for processing substrates.

SUMMARY

Apparatus for processing substrates are provided herein. In some embodiments, an apparatus for processing substates includes a gas distribution plate that includes an upper plate and a lower plate and a solid disk between the upper plate and the lower plate. Each of the upper plate and the lower plate has a central region and an outer region surrounding the central region. The central region is solid and the outer region includes a plurality of through holes. The upper plate and the lower plate are coaxially aligned along a central axis extending through a center of the central region of the upper plate and a center of the central region of the lower plate. The solid disk is coaxially aligned with the upper plate and the lower plate. The solid disk is configured to block transmission of ultraviolet radiation through the solid disk.

Also, in some embodiments, an apparatus for processing substrates includes a gas distribution plate that includes a first plate having a central region and an outer region surrounding the central region, and a solid disk aligned with the central region of the first plate. The central region of the first plate is solid and the outer region includes a plurality of through holes. The first plate is configured to permit transmission of ultraviolet radiation through the central region and the outer region. The solid disk is configured to block transmission of ultraviolet radiation through the solid disk.

In some embodiments, an apparatus for processing substrates includes a substrate processing chamber that includes a remote plasma source having an exit hole centered about a longitudinal axis, a cleaning chamber in fluid communication with the exit hole, and a support disposed in the cleaning chamber and spaced longitudinally from the exit hole. The support is configured to support a substrate in the cleaning chamber. Also, the substrate processing chamber includes a gas distribution plate spaced longitudinally between the exit hole and the support and extending across the exit hole and the support in a direction transverse to the longitudinal axis. The gas distribution plate includes an upper plate and a lower plate, each having a central region and an outer region surrounding the central region, where the central region is solid and the outer region includes a plurality of through holes. The upper plate and the lower plate are coaxially aligned along the longitudinal axis extending through the central region of the upper plate and the central region of the lower plate. Also, the gas distribution plate includes a solid disk disposed between the upper plate and the lower plate. The solid disk is coaxially aligned with the upper plate and the lower plate. The solid disk is configured to block transmission of ultraviolet radiation through the solid disk.

In some embodiments, a method for protecting a substrate from exposure to UV radiation includes emitting UV radiation from a UV radiation source toward a substrate disposed on a support; and positioning a UV blocking disc between the UV radiation source and the support to protect the substrate from direct UV exposure to the UV radiation.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
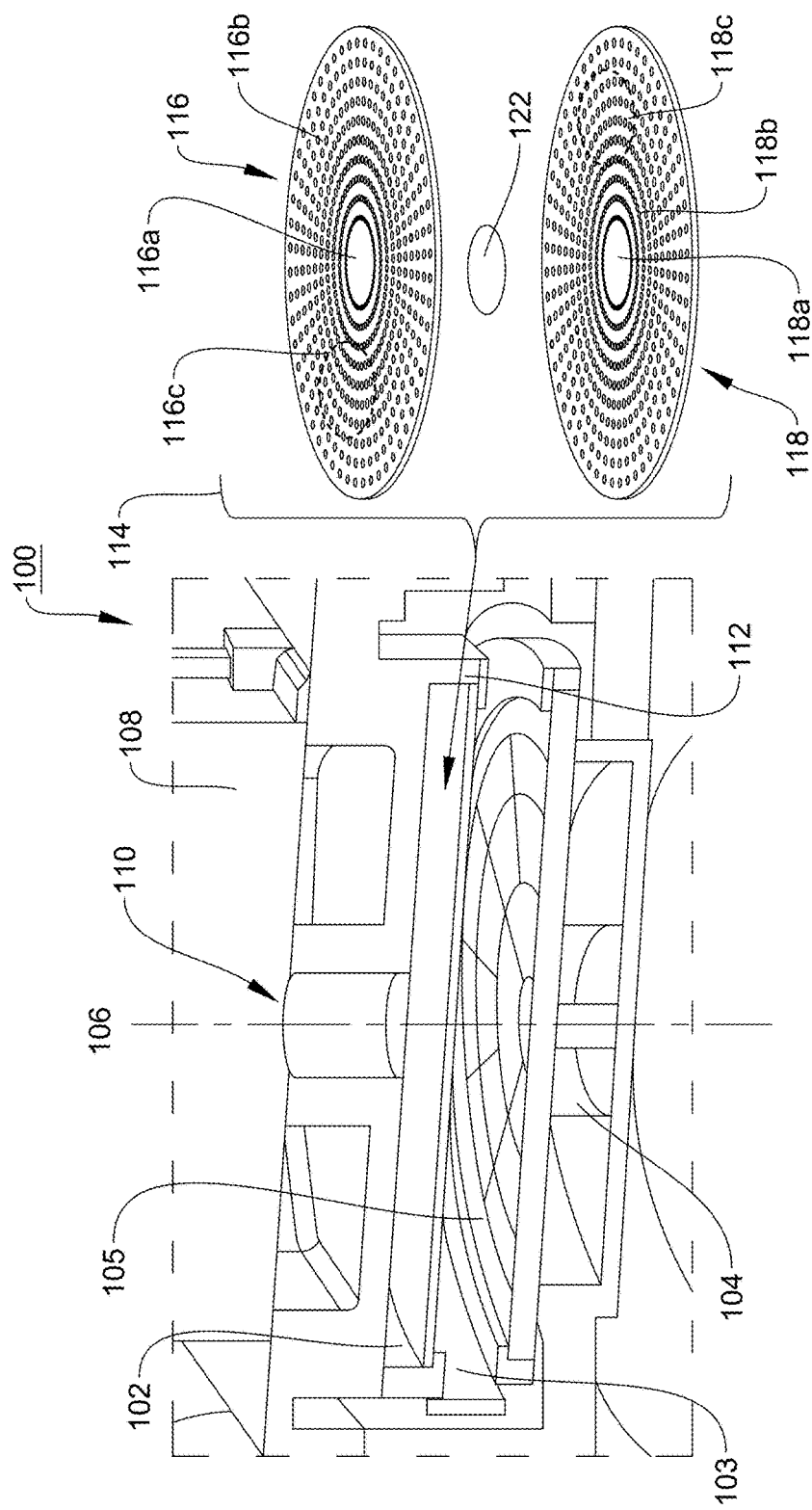
FIG. 1 depicts a partial section view of a processing tool having a processing chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of processing chambers for processing substrates are provided herein. In embodiments, the processing chambers are configured to clean the substrates to remove unwanted particles or residue. The substrates may be, for example, semiconductor wafers, photomasks, or the like. In the example of the photomasks, photoresist may be left on the substrate. Gas plasma stripping is one way of removing photoresist. The dissociated residue may then be removed from an interior volume of the processing chamber. One byproduct of gas plasma stripping may be UV radiation, which can damage the substrate.

FIG. 1 depicts a partial section view of a processing tool 100 having a processing chamber 102 for housing and processing a substrate (not shown) in accordance with at least some embodiments of the present disclosure. The processing chamber 102 defines an interior volume 103 in which a substrate support 104 is located. The substrate support 104 is shown in the form of a flat platform (platform 105) supported by the processing chamber 102. The platform 105 is configured to support a substrate (not shown) in a substantially horizontal position transverse to a longitudinal axis 106 in the interior volume 103 of the processing chamber 102. The longitudinal axis 106 may extend through a center of the substrate support 104, as shown in FIG. 1.

The processing tool 100 also includes a remote plasma source 108 spaced longitudinally from the substrate support 104. The remote plasma source 108 is configured to supply plasma radicals to the interior volume 103 of the processing chamber 102. The remote plasma source 108 has an exit hole 110 coaxial with the longitudinal axis 106 and the substrate support 104. The exit hole 110 is in fluid communication with the processing chamber 102 and the interior volume 103. UV radiation emitted by the remote plasma source 108 can exit through the exit hole 110 into the interior volume 103.

The processing chamber 102 has a flange 112 spaced longitudinally between the exit hole 110 and the substrate support 104. As will be described in greater detail below, the flange 112 is configured to support a gas distribution plate 114 in longitudinally spaced relation between the exit hole 110 and the substrate support 104 and extending across the exit hole 110 and the substrate support 104 in a direction substantially (+/−10 degrees) transverse to the longitudinal axis 106.

The gas distribution plate 114 may include an upper plate 116 and a lower plate 118. The upper plate 116 has a central (e.g., circular) region 116a and an outer (e.g., annular) region 116b surrounding the central region 116a. The lower plate 118 has a central (e.g., circular) region 118a and an outer (e.g., annular) region 118b surrounding the central region 118a. The central regions 116a, 118a are solid and the outer regions 116b, 118b include a plurality of through holes 116c, 118c, respectively, for transmission of gas. The upper plate 116 and the lower plate 118 are configured for coaxial alignment along the longitudinal axis 106 extending through the central region 116a of the upper plate 116 and the central region 118a of the lower plate 118. The central regions 116a, 118a may have the same size and shape (e.g., circular), the outer regions 116b, 118b may have the same size and shape (e.g., annular), and the plurality of through holes 116c, 118c may have the same size, shape, (e.g., circular), and pattern. The through holes 116c of the upper plate 116 are configured to align with the through holes 118c of the lower plate 118 to facilitate gas flow through the gas distribution plate 114.

The upper plate 116 and the lower plate 118 may be made of UV transmissible materials, such as quartz (e.g., GE 124 fused quartz). Besides being UV transmissible, such materials may also be selected for their resistance to extinguishing radicals on the surfaces of the upper plate 116 and the lower plate 118.

The gas distribution plate 114 may also include a solid disk 122. In the embodiment shown in FIGS. 1, 2, and 3, the solid disk 122 is disposed between the upper plate 116 and the lower plate 118. The solid disk 122 may be encapsulated between the upper plate 116 and the lower plate 118. Encapsulation of the solid disk 122 may prevent the solid disk 122 from extinguishing radicals if the solid disk 122 is made from materials, such as aluminum, that may extinguish radicals.

The solid disk 122 may be configured to coaxially align with the upper plate 116 and the lower plate 118 along the longitudinal axis 106. The solid disk 122 is configured to block transmission of UV radiation through the solid disk 122. For example, the solid disk may be formed of a UV blocking material, such as, for example, black quartz (HBQ®100, a registered trademark of Heraeus Holding GmbH, Hanau, Germany), low resistivity silicon (resistivity less than 0.01 ohm-cm), or aluminum.

Figure 2:
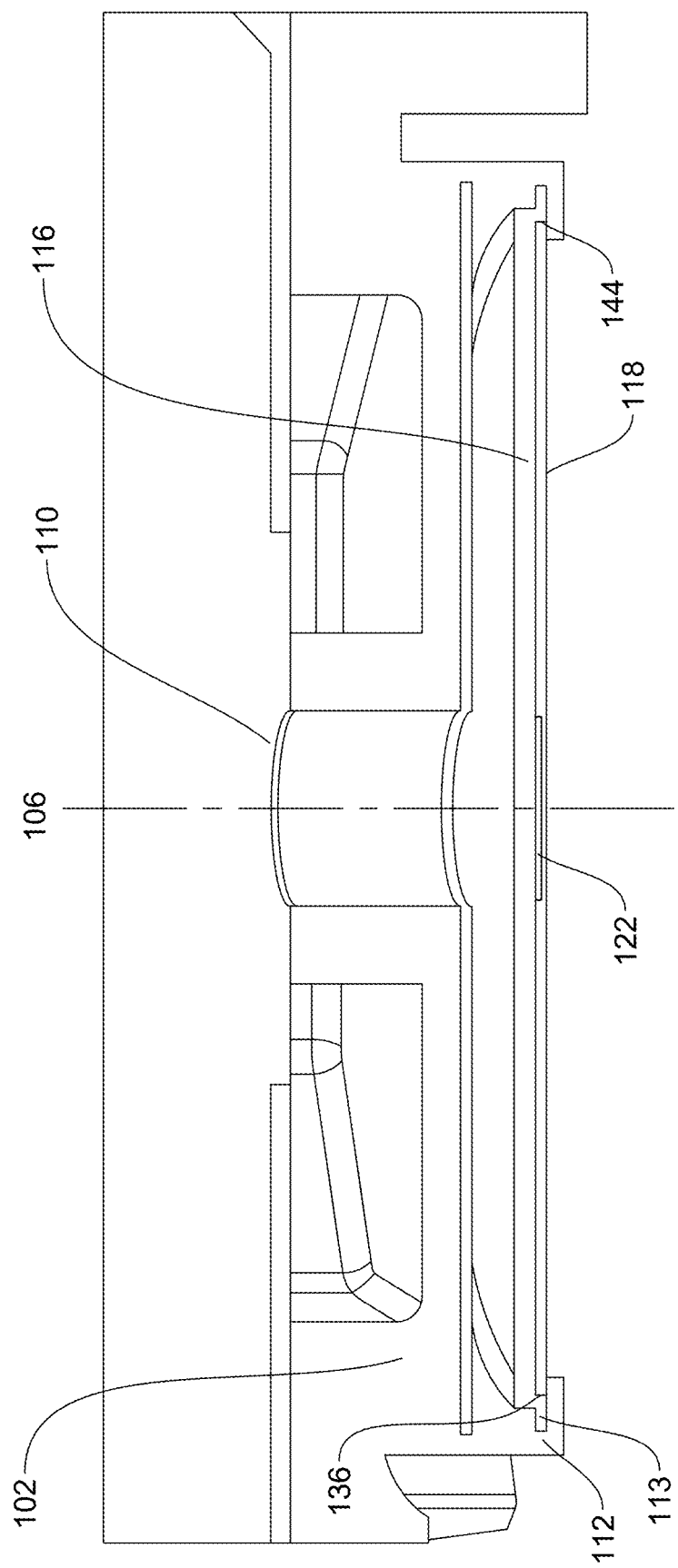
FIG. 2 depicts a gas distribution plate and UV blocking disk arrangement connected to the processing tool depicted in FIG. 1.

As shown in FIG. 2, when the gas distribution plate 114 is connected to the flange 112 of the processing chamber 102, the solid disk 122 may project over the area of the exit hole 110 and be disposed longitudinally between the exit hole 110 and the substrate support 104 so that UV radiation emitted through the exit hole 110 directed toward the substrate support 104 can be blocked by the solid disk 122 to protect a substrate (not shown) supported by the substrate support 104 from exposure to UV radiation.

The solid disk 122 may have an area that is equal to or larger than an area of the exit hole 110 so that the area of the solid disk 122 projects fully across or overlaps the area of the exit hole 110. For example, in embodiments, the solid disk 122 and the exit hole 110 may be circular and the solid disk 122 may have a diameter that is 10% to 15% larger than a diameter of the exit hole 110. Also, the solid disk 122 may have an area that is equal to or larger than the central region 116a of the upper plate 116 and/or the central region 118a of the lower plate 118. The solid disk 122 may be sized so that the solid disk 122 does not cover any of the through holes 116c in the upper plate 116 and any of the through holes 118c in the lower plate 118. In some embodiments, the solid disk 122 has a diameter of about 2.5 inches and a thickness of about 0.03 inch.

Figure 3:
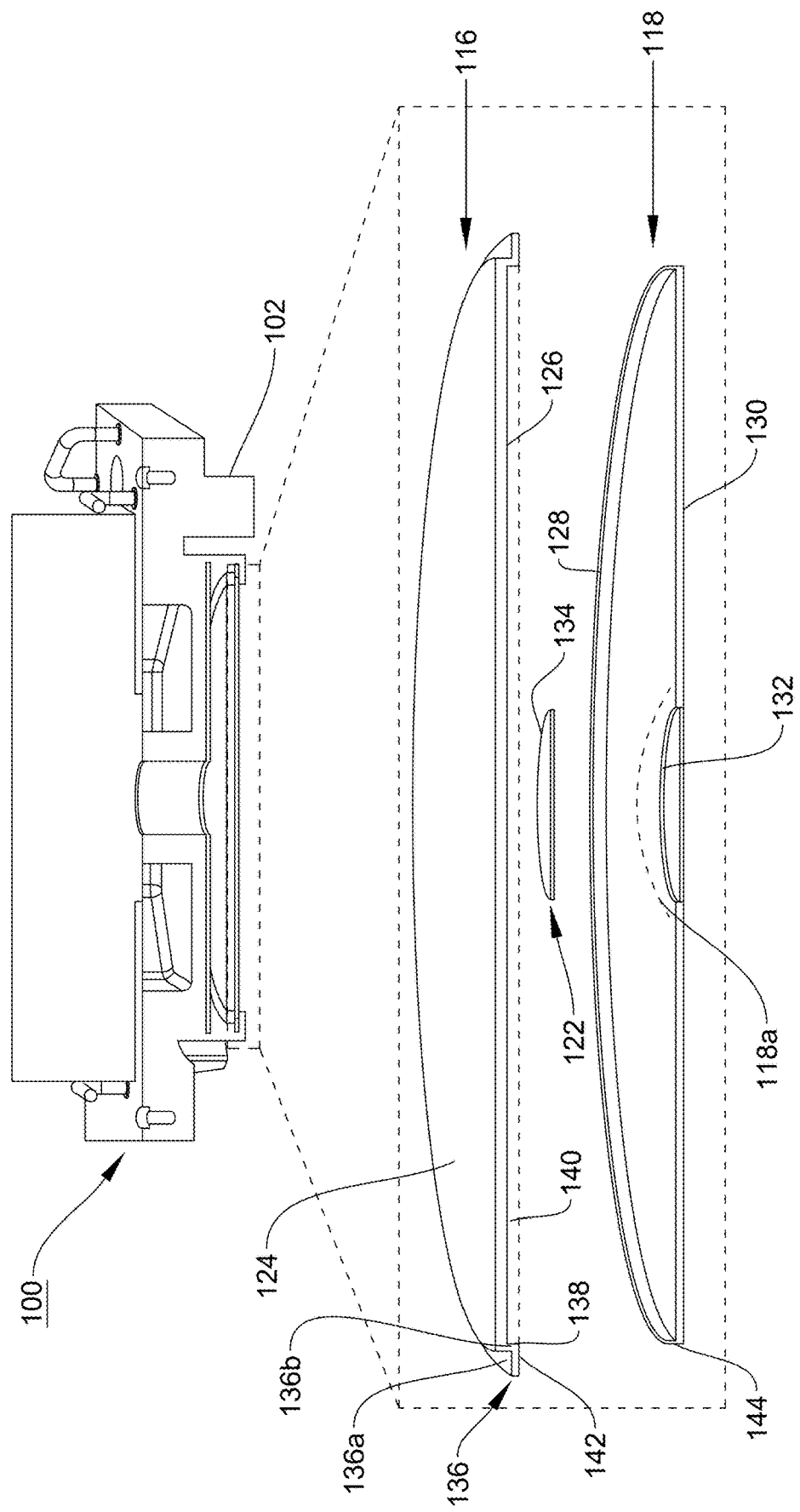
FIG. 3 depicts an exploded view of the gas distribution plate and UV blocking disk arrangement depicted in FIG. 2.

As shown in FIG. 3, the upper plate 116 may have an upper surface 124 that is planar and a lower surface 126 that is planar. The central region 116a and the outer region 116b of the upper plate 116 may be coplanar and define the lower surface 126. Also, the lower plate 118 may have an upper surface 128 that is planar and a lower surface 130 that is planar. When the upper plate 116 and the lower plate 118 are assembled with the solid disk 122, as shown in FIG. 2, the lower surface 126 of the upper plate 116 may be in contact with the upper surface 128 of the lower plate 118. A disk receiving recess 132 may be defined in the central region 118a of the upper surface 128 of the lower plate 118. The disk receiving recess 132 is configured to receive and support at least a portion of the solid disk 122. In the embodiment shown in FIG. 3, the disk receiving recess 132 has a sufficient depth such that an upper surface 134 of the solid disk 122 is flush with or recessed below the upper surface 128 of the lower plate 118. In some embodiments, the upper plate 116 may define a recess (not shown) in the lower surface 126 of the upper plate 116 to fully receive the solid disk 122. Also, in some embodiments, the upper plate 116 may have a recess (not shown) in the lower surface 126 and the lower plate 118 may have a recess (not shown) in the upper surface 128 such that both recesses together define a single cavity for retaining the solid disk 122.

As shown in FIG. 3, the upper plate 116 has a peripheral flange 136 extending around the outer region 116b of the upper plate 116. The peripheral flange 136 has a longitudinal portion 136a and a transverse portion 136b extending from the longitudinal portion 136a so that the peripheral flange 136 has a generally L-shaped cross-section. The transverse portion 136b of the peripheral flange 136 is configured to be received in a retaining groove 113 of the flange 112 of the processing chamber 102, as shown in FIG. 2.

As shown in FIG. 3, the longitudinal portion 136a of the peripheral flange 136 has an inner surface 138 that extends longitudinally from the lower surface 126 of the upper plate 116. The inner surface 138 and the lower surface 126 of the upper plate 116 define a plate receiving recess 140 configured to receive the lower plate 118 in a nested configuration, as is shown in FIG. 2. In some embodiments, a lower surface 142 of the transverse portion 136b of the peripheral flange 136 is configured to be coplanar with the lower surface 130 of the lower plate 118 when the lower plate 118 is received in the plate receiving recess 140, as is shown in FIG. 2. Also, the lower plate 118 has a peripheral edge 144 extending around the outer region 118b of the lower plate 118. The peripheral edge 144 may engage the inner surface 138 of the longitudinal portion 136a of the peripheral flange 136 when the lower plate 118 is received in the plate receiving recess 140, as shown in FIG. 2.

The gas distribution plate 114 shown in FIG. 2 may be assembled by placing the solid disk 122 into the disk receiving recess 132 and then placing the upper plate 116 over and onto the lower plate 118 so that the lower plate is received in the plate receiving recess 140.

While the foregoing is directed to embodiments of the present disclosure, other and further embodiments of the disclosure may be devised without departing from the basic scope thereof. For example, while the gas distribution plate 114 described above includes a plurality of plates (upper plate and a lower plate), in other embodiments, a gas distribution plate may have only one plate configured to retain a solid, UV blocking disk, like the solid disk 122. Also, in other embodiments, the gas distribution plate is formed completely of a single plate of a UV blocking material, such as black quartz or low resistivity silicon.

The invention claimed is:

1. A method for protecting a substrate from exposure to UV radiation, comprising:
supporting a substrate on a substrate support; and
emitting UV radiation from a UV radiation source toward the substrate disposed on the substrate support wherein,
a UV blocking disc is positioned between the UV radiation source and the substrate support to protect the substrate from direct UV exposure to the UV radiation,
wherein a UV transmissible plate is disposed between the UV radiation source and the substrate,
wherein the UV blocking disc is supported by the UV transmissible plate, and
wherein the UV blocking disc is received in a recess of a closed portion of the UV transmissible plate and an upper surface of the UV blocking disc is flush with or recessed below an upper surface of the UV transmissible plate.

2. The method of claim 1, wherein UV radiation is emitted from an exit hole of the UV radiation source and positioning includes aligning the UV blocking disc with the exit hole and the substrate.

3. The method of claim 2, wherein the UV blocking disc is in a position where the UV blocking disc projects over an area of the exit hole.

4. The method of claim 3, wherein the UV blocking disc has an area equal to or larger than an area of the exit hole, and when disposed in the position, the UV blocking disc extends across the exit hole.

5. The method of claim 1, wherein the UV transmissible plate is axially aligned with the UV blocking disc.

6. The method of claim 1, wherein the UV transmissible plate is connected to a processing chamber that houses the substrate support.

7. The method of claim 1, wherein the UV transmissible plate includes a plurality of through holes to permit gas flow through the UV transmissible plate, the method further comprising flowing a gas through the plurality of through holes.

8. The method of claim 1, wherein the UV transmissible plate is formed of quartz.

9. The method of claim 1, wherein the UV blocking disc is formed of at least one of black quartz, silicon, or aluminum.

10. The method of claim 1, wherein the UV radiation source comprises a remote plasma source.

11. The method of claim 1, wherein the UV blocking disc is positioned between the UV transmissible plate and another UV transmissible plate.

12. The method of claim 11, wherein the UV transmissible plate and the other UV transmissible plate each includes a plurality of through holes, the method further comprising flowing a gas through the plurality of through holes.

13. A method for protecting a substrate from exposure to UV radiation, comprising:
supporting a substrate on a substrate support; and
emitting UV radiation from a UV radiation source toward the substrate disposed on the substrate support wherein,
a UV blocking disc is positioned between the UV radiation source and the substrate support to protect the substrate from direct UV exposure to the UV radiation,
wherein a UV transmissible plate is disposed between the UV radiation source and the substrate,
wherein the UV blocking disc is supported by the UV transmissible plate,
wherein the UV blocking disc is received in a recess of the UV transmissible plate and an upper surface of the UV blocking disc is flush with or recessed below an upper surface of the UV transmissible plate, and
wherein the UV blocking disc is encapsulated between the UV transmissible plate and another UV transmissible plate.

14. The method of claim 13, wherein the UV transmissible plate and the other UV transmissible plate each includes a plurality of through holes, the method further comprising flowing a gas through the plurality of through holes.

* * * * *